United States Patent
Lee et al.

(10) Patent No.: US 7,142,414 B2
(45) Date of Patent: Nov. 28, 2006

(54) SIGNAL MANAGEMENT SYSTEM

(75) Inventors: John Lee, Whitby (CA); Richard Martin, Whitby (CA); Brad Nikkari, Brooklyn (CA); Luc Matteau, Peterborough (CA); Tasos Lambos, Toronto (CA); Troy Beggs, Ajax (CA)

(73) Assignee: PCI Technologies, Inc., Ontario (CA)

( * ) Notice: Subject to any disclaimer, the term of this patent is extended or adjusted under 35 U.S.C. 154(b) by 76 days.

(21) Appl. No.: 10/940,950

(22) Filed: Sep. 15, 2004

(65) Prior Publication Data

US 2005/0094359 A1    May 5, 2005

Related U.S. Application Data

(60) Provisional application No. 60/502,609, filed on Sep. 15, 2003.

(51) Int. Cl.
    *G06F 1/16* (2006.01)
(52) U.S. Cl. .................................... 361/679
(58) Field of Classification Search ............ 361/379, 361/679
    See application file for complete search history.

(56) References Cited

U.S. PATENT DOCUMENTS

| | | |
|---|---|---|
| 5,903,829 A | 5/1999 | Anderson et al. |
| 5,909,155 A | 6/1999 | Anderson et al. |
| 5,955,930 A | 9/1999 | Anderson et al. |
| 5,966,648 A | 10/1999 | Ortberg et al. |
| 6,046,913 A | 4/2000 | Helmstetter et al. |
| 6,049,709 A | 4/2000 | Anderson et al. |
| 6,102,214 A | 8/2000 | Mendoza |
| 6,144,561 A | 11/2000 | Canella, Jr. et al. |
| 6,195,493 B1 | 2/2001 | Bridges |
| 6,289,210 B1 | 9/2001 | Anderson et al. |
| 6,650,885 B1 * | 11/2003 | Anderson et al. ........... 455/349 |
| 6,717,486 B1 | 4/2004 | Khemakhem et al. |
| 2003/0030977 A1 * | 2/2003 | Garnett et al. .............. 361/687 |

* cited by examiner

Primary Examiner—Yean-Hsi Chang
(74) Attorney, Agent, or Firm—Blank Rome LLP

(57) ABSTRACT

A signal management system that includes a chassis and a plurality of signal management modules supported by said chassis. Each module has a housing with input and output connectors and electronic circuitry electrically connecting the input and output connectors. One of the input and output connectors is a miniature coaxial connector. Each of the input and output connectors of the modules being connected to cables carrying one of either RF and optical signals.

31 Claims, 7 Drawing Sheets

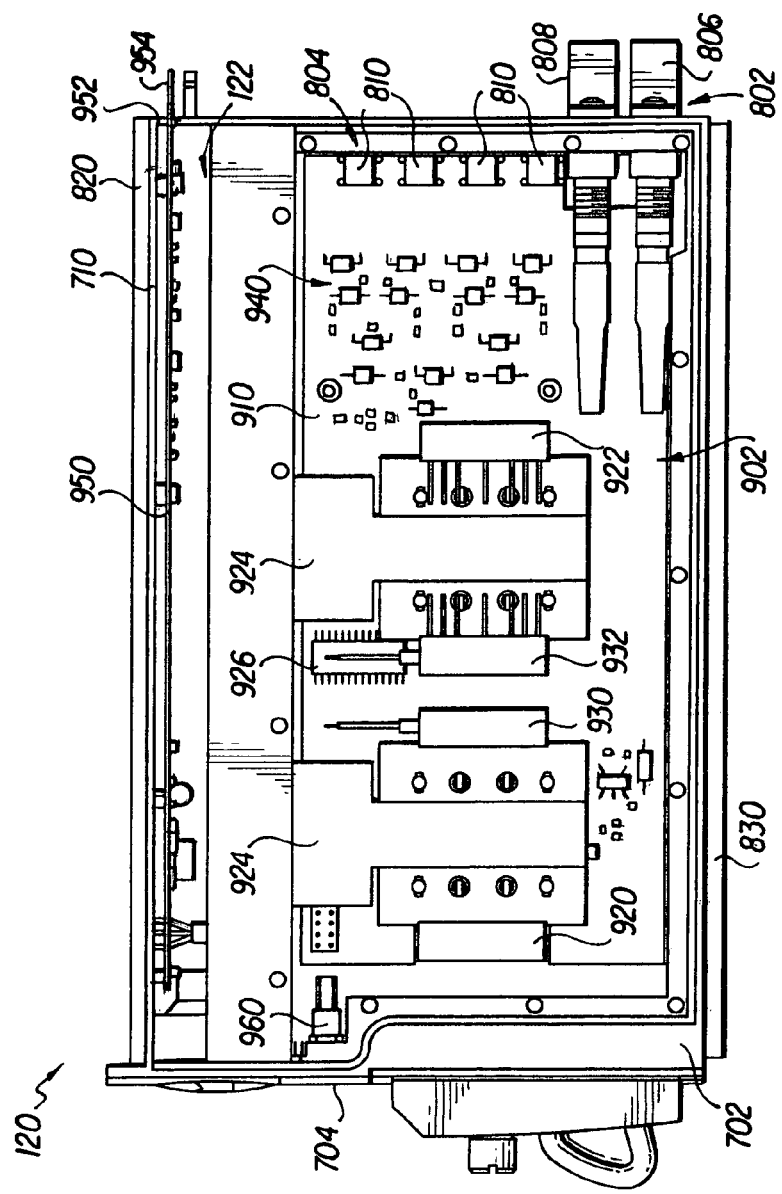
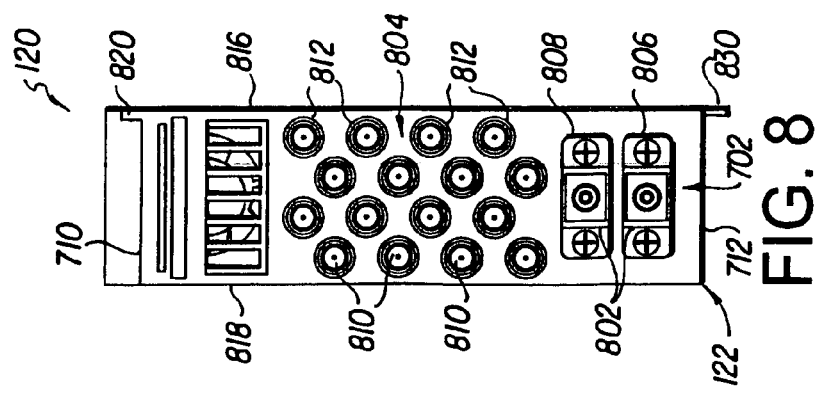
FIG. 9
FIG. 8

SIGNAL MANAGEMENT SYSTEM

RELATED APPLICATION

This application claims the benefit of U.S. Provisional Patent Application Ser. No. 60/502,609 for Integrated RF and Optical Signal Management Platform, filed Sep. 15, 2003, the subject matter of which is incorporated by reference.

FIELD OF THE INVENTION

The present invention relates to the field of radio-frequency (RF) and optical management systems and more particularly to modular RF and optical circuit components and chassis configurations for supporting and interconnecting active and passive RF circuit modules and combined RF and optical modules.

BACKGROUND OF THE INVENTION

In the telecommunications industry, broadband RF and optical signals are transferred and delivered to consumers via conductors from a head end located, for example, at the central office of a CATV telecommunications company. At the head end, a variety of RF circuit modules and optical modules are typically mounted in specially designed chassis components which are installed in a rack. The modules carry out the many kinds of RF and optical signal modifications and manipulations necessary to operate a telecommunications system, such as a CATV system.

Conventional chassis components for distribution systems and their associated modules require significant space within a standard distribution rack. For example, some conventional chassis are at least 5 RU in height or greater. In addition, the conventional chassis support a very limited number of modules. Also, the versatility and flexibility of the conventional chassis are limited because they cannot support a variety of telecommunications modules. Further, separate modules are often required to perform different management functions. For example, optical receivers and optical transmitters are provided in modules separate from RF signal management modules, such as RF signal splitters and combiners, thereby requiring multiple modules to convert optical signals to RF signals or vice versa, and split or combine the converted signals. In addition, optical modules and RF modules are typically mounted in separate chassis components, thereby requiring additionally connections between more than one chassis component. Mounting and securing the modules within the chassis typically requires bolting the individual modules to the chassis making installation and removal of the modules from the chassis difficult and time consuming.

Examples of conventional circuit modules and chassis components are disclosed in U.S. Pat. Nos. 6,717,486; 6,289,210; 6,195,493; 6,144,561; 6,102,214; 6,049,709; 6,046,913; 5,966,648; 5,955,930; 5,909,155; and 5,903,829, the subject matter of each of which is incorporated by reference.

SUMMARY OF THE INVENTION

Accordingly, an object of the present invention is to provide a signal management system that is both compact and supports a higher density of signal management modules than conventional systems.

Another object of the present invention is to provide a signal management system that combines optical and RF signal management into a single module.

Yet another object of the present invention is to provide a signal management system having a fastener-less mounting arrangement between a chassis of the the system and the modules supported by the chassis.

The foregoing objects are attained by a signal management system that includes a chassis and a plurality of signal management modules supported by that chassis. Each module has a housing with input and output connectors and electronic circuitry electrically connecting the input and output connectors. One of the input and output connectors is a miniature coaxial connector. Each of the input and output connectors of the modules being connected to cables carry one of either RF and optical signals.

The foregoing objects are also attained by a signal management system that has a single module including an input connector, a plurality of output connectors, and electronic circuitry disposed within the module electrically connecting the input connector to the plurality of output connectors. The electronic circuitry includes a printed circuit board, and at least one optical signal receiver and an RF signal splitter connected to the printed circuit board. The input connector receives an optical signal carrying cable and each of the plurality of output connectors are connected to an RF signal carrying cable. When an optical signal enters the module at the input connector, the signal is converted to an RF signal by the optical receiver and is split into multiple RF signals by the RF signal splitter. Each of the multiple RF signals exit the module at one of the plurality of output connectors.

The foregoing objects are also attained by a signal management system, that has a single module including a plurality of input connectors, an output connector, and electronic circuitry disposed within the module electrically connecting the plurality of input connectors to the output connector. The electronic circuitry includes a printed circuit board, and at least one optical signal transmitter and an RF signal combiner connected to the printed circuit board. Each of the input connectors receives an RF signal carrying cable and the output connector is connected to an optical signal carrying cable. When RF signals enter the module at each of the plurality of input connectors, the signals are combined to a single RF signal by the RF signal combiner, and the single RF signal is converted to an optical signal by the optical transmitter. The optical signal exits the module at the output connector.

The foregoing objects are also attained by a signal management system that has a chassis with first and second walls. The first wall includes a biasing member extending therefrom and the second wall includes at least one slot. At least one signal management module is supported between the first and second walls of the chassis. The module includes opposite first and second side walls with a flange extending from the second side wall. The flange is received in the slot of the second wall of the chassis, and the biasing member engages the first side wall of the module thereby biasing the module toward the second wall of the chassis to hold the module between the first and second walls of the chassis.

Other objects, advantages and salient features of the invention will become apparent from the following detailed description, which, taken in conjunction with the annexed drawings, discloses a preferred embodiment of the present invention.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 8 is a rear elevational view of the module illustrated in FIG. 7;

FIG. 9 is a side elevational view of the module illustrated in FIG. 1, showing the module with a side wall removed;

DETAILED DESCRIPTION OF THE INVENTION

Figure 1:
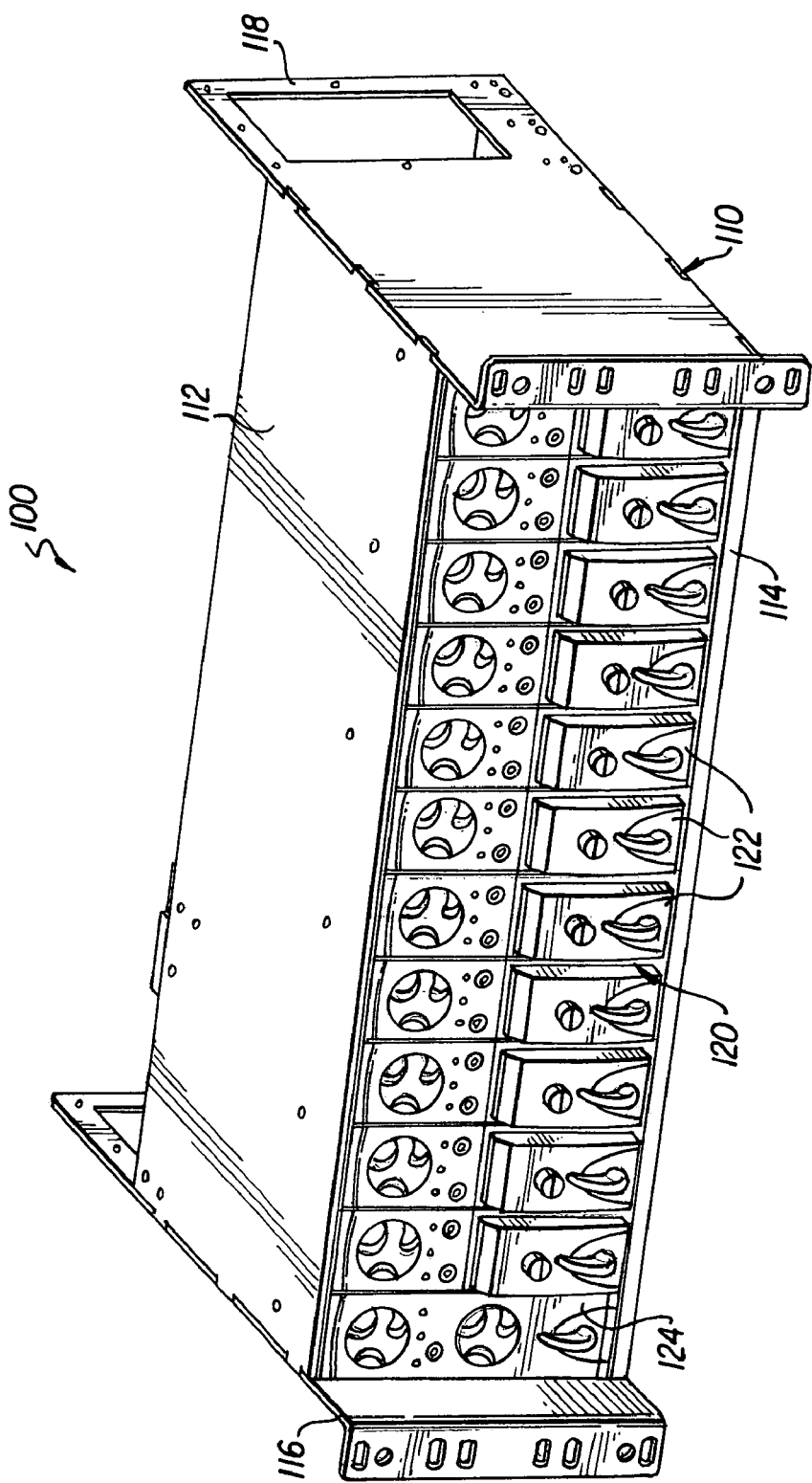
FIG. 1 is a front perspective view of the signal management system in accordance with an embodiment of the present invention, showing a chassis supporting a plurality of modules.

Referring to FIGS. 1–12, a signal management system 100 in accordance with the present invention generally includes a chassis 110 supporting a set of signal management modules 120. The chassis 110 is preferably mounted in a conventional distribution rack (not shown) along with other signal management chassis for distribution of broadband services. A conventional distribution rack is described in copending, commonly assigned U.S. patent application Ser. No. 10/158,050 for RF Circuit Modules and Integrated Chassis With Power, filed May 31, 2002, the subject matter of which is incorporated by reference. The chassis 110 is preferably 3 RU in height (about 1¼ inches per RU) and supports up to 12 dual modules (about 1.5 inches wide), 24 single modules (about 0.70 inches wide), or a combination of both. The chassis 110 is therefore more compact and supports a higher density of modules than the conventional 5 RU chassis which supports only 6 dual modules or 12 single modules. In addition, a greater number of the chassis 110 can be mounted in a single rack, thereby reducing the number of racks and thus space required to accommodate a signal distribution system.

Figure 2:
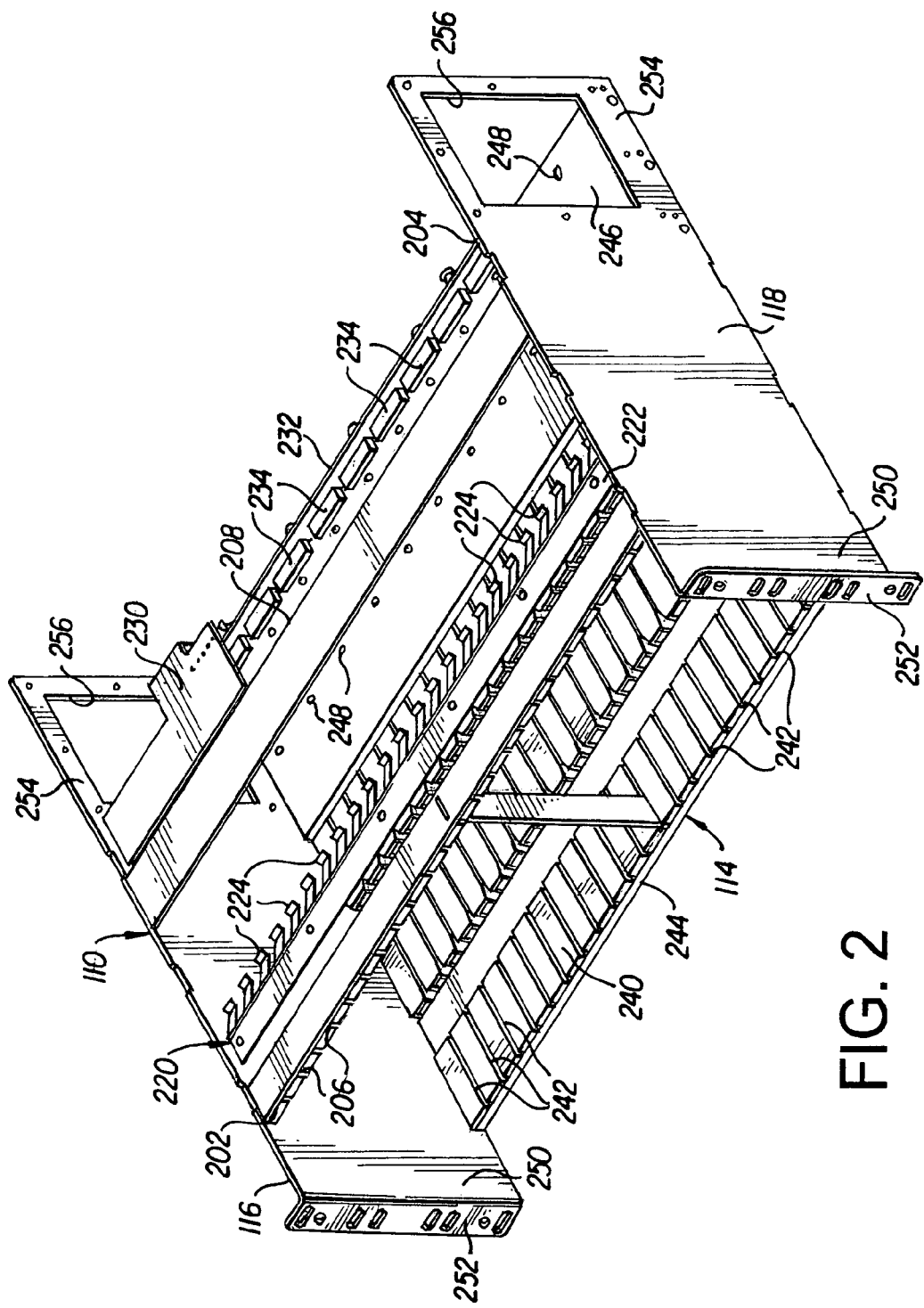
FIG. 2 is a front perspective view of the chassis of the signal management system illustrated in FIG. 1, showing the chassis with a wall removed.

The chassis 110 is metal and includes upper and lower walls 112 and 114 extending between first and second sidewalls 116 and 118. As best seen in FIG. 2, the front and back 202 and 204 of the chassis 110 are open, allowing installation of the set of modules 120 and connection of signal carrying cables to the set of modules 120. The set of modules 120 can include any type of signal management modules in any combination. For example, as illustrated in FIG. 1, the set of modules 120 can include modules 122 that each combine optical and RF signal management technology and include at least one power supply module 124. The modules 122 can also be either dual or single modules and any one of an RF signal passive or active module, an amplifier module, a switching module, a splitter module, a combiner module, a directional coupler module, an RF detector module, a power supply module, and an optical receiver or transmitter module.

Figure 3:
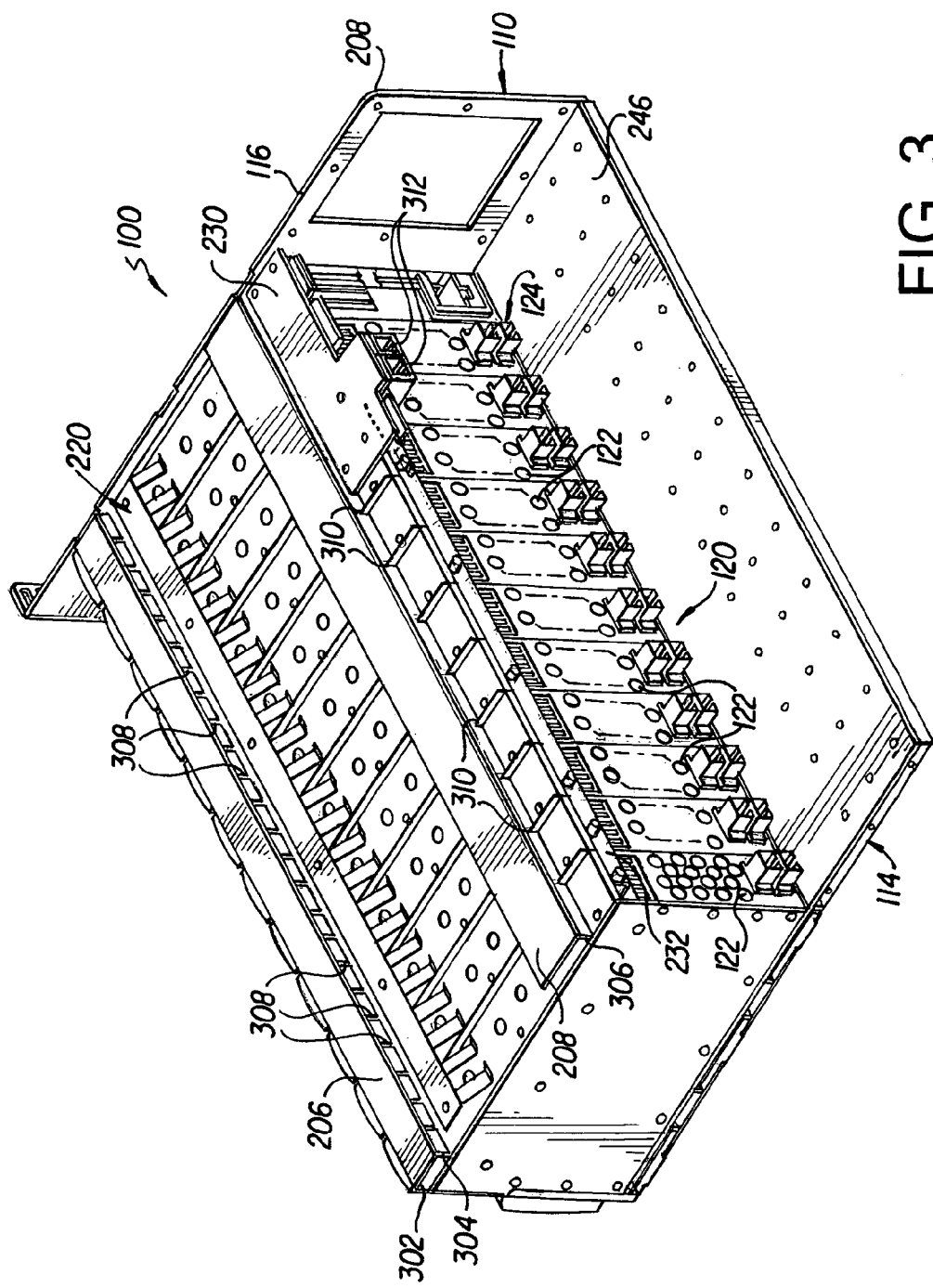
FIG. 3 is a rear perspective view of the signal management system illustrated in FIG. 1, showing two walls of the chassis removed.
Figure 5:
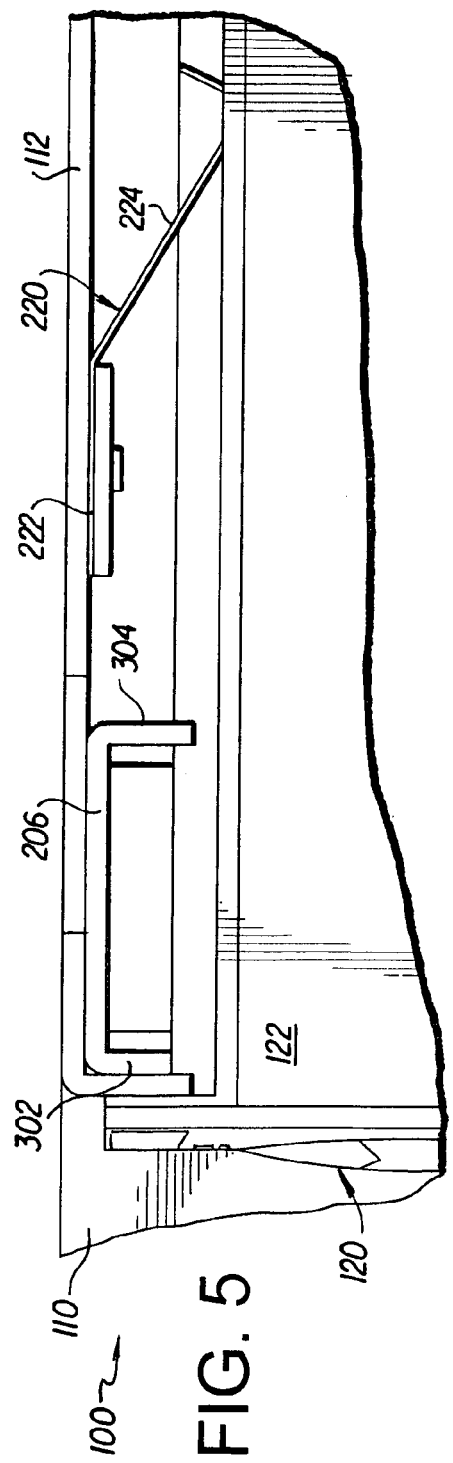
FIG. 5 is a partial, enlarged side elevational view in section of the signal management system illustrated in FIG. 1, showing the engagement of a module with the chassis.

Connected to the inner surface of the upper wall 112 are first and second brackets 206 and 208 that extend between the sidewalls 116 and 118. As seen in FIGS. 3 and 5, the first bracket 206 is generally C-shaped in cross-section and includes front and back legs 302 and 304. The second bracket 208 is generally L-shaped in cross-section and includes a back leg 306. Each of the first and second brackets 206 and 208 includes a plurality of slots 308 and 310. The slots 308 and 310 are laterally aligned with one another, as seen in FIG. 3.

A biasing member 220 is also attached to the upper wall 112 and extends downwardly to engage each of the modules 122 and the module 124 of the set of modules 120, as seen in FIGS. 3 and 5. The biasing member 220 preferably includes a main section 222 that extends between the first and second sidewalls 116 and 118 of the chassis 110. A plurality of spring fingers 224 extend from the main section 222 to engage and bias the set of modules 120 toward the lower wall 114 of the chassis 110, as seen in FIGS. 3 and 5. The biasing member 220 can be any type of biasing or spring structure, such as one or more compression springs.

Figure 4:
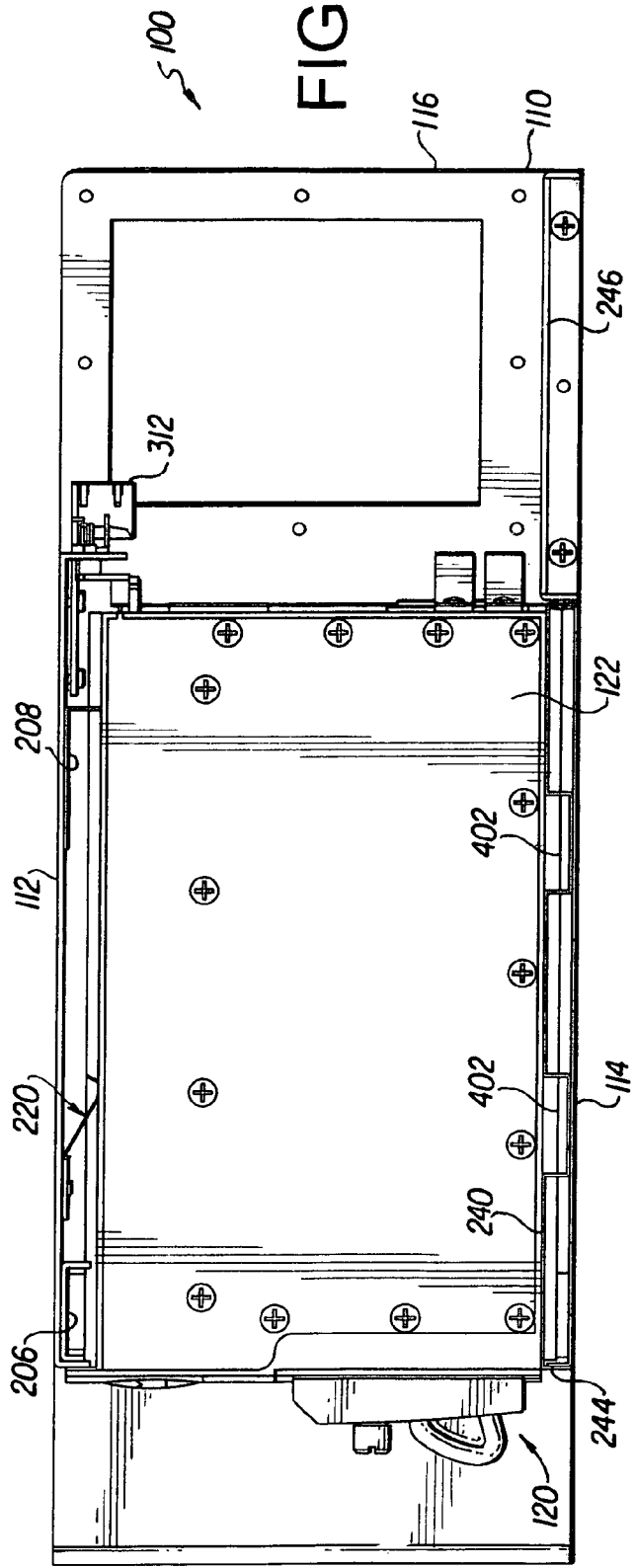
FIG. 4 is a side elevational view in section of the signal management system illustrated in FIG. 1, showing modules supported in the chassis.
Figure 6:
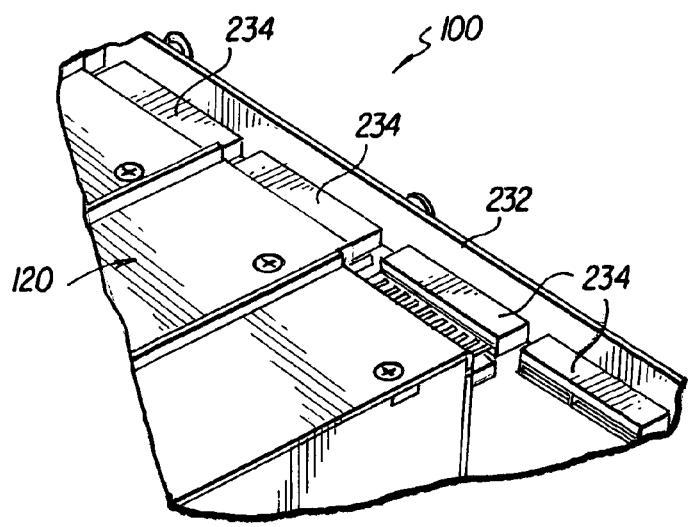
FIG. 6 is a partial perspective view of the signal management system illustrated in FIG. 1, showing connectors of the chassis connected to the modules supported in the chassis.

A main communication printed circuit board 230 is attached to the upper wall 112, as seen in FIGS. 2 and 4. Connected to and extending from the board 230 toward the chassis lower wall 114 is a daughter printed circuit board 232 that has a plurality of card edge connectors 234 for connection to the individual modules 122 and 124, as best seen in FIGS. 2 and 6, thereby electrically and mechanically connecting each of the modules 122 and 124. Standard RJ45 connectors 312 are connected to main board 230, providing electrical connection to other chassis supported in the rack.

The lower wall 114 of the chassis 110 includes a raised platform 240 with channels 402 that provide rigidity to the platform 240, as seen in FIGS. 2 and 4. The raised platform 240 includes a plurality of evenly spaced elongated slots 242. The elongated slots 242 are vertically aligned with the slots 308 and 310 of the first and second brackets 206 and 208. The raised platform 240 includes a front shoulder 244 extending between the chassis first and second sidewalls 116 and 118 closing off the elongated slots 242 at the front 202 of the chassis. The lower wall 114 also includes a cable management platform 246 extending from the back 204 of the chassis 110, as best seen in FIGS. 2 and 4. The cable management platform 246 can be any conventional cable management structure, such as a bar or plate, and can include any cable retaining structure, such as holes 248 for receiving ties (not shown) to tie to the cables, hooks, channels and the like.

Each of the sidewalls 116 and 118 includes front extensions 250 with rack mounting flanges 252 and rear extensions 254 adjacent the cable management platform 246 with substantially square apertures 256. The apertures 256 provide venting for the chassis and support for the cable management platform 246.

As seen in FIGS. 7–10, each of the modules 122 and the module 124 of the set of modules 120 (FIG. 1) generally includes a housing 702 with an input area 802 and an output area 804 connected to electronic circuitry 902 supported within the housing 702 for performing a designated signal management function, such as optical signal receiving or transmitting, signal amplification, signal switching, signal splitting or combining, detecting RF signal, signal monitoring or supplying power. For example, the modules 122 can combine optical and RF signal management and module 124 can be a power supply module. As described above, the modules can be any type of signal management modules. For purposes of clarity, the combined optical and RF signal management modules 122 will be described.

Figure 7:
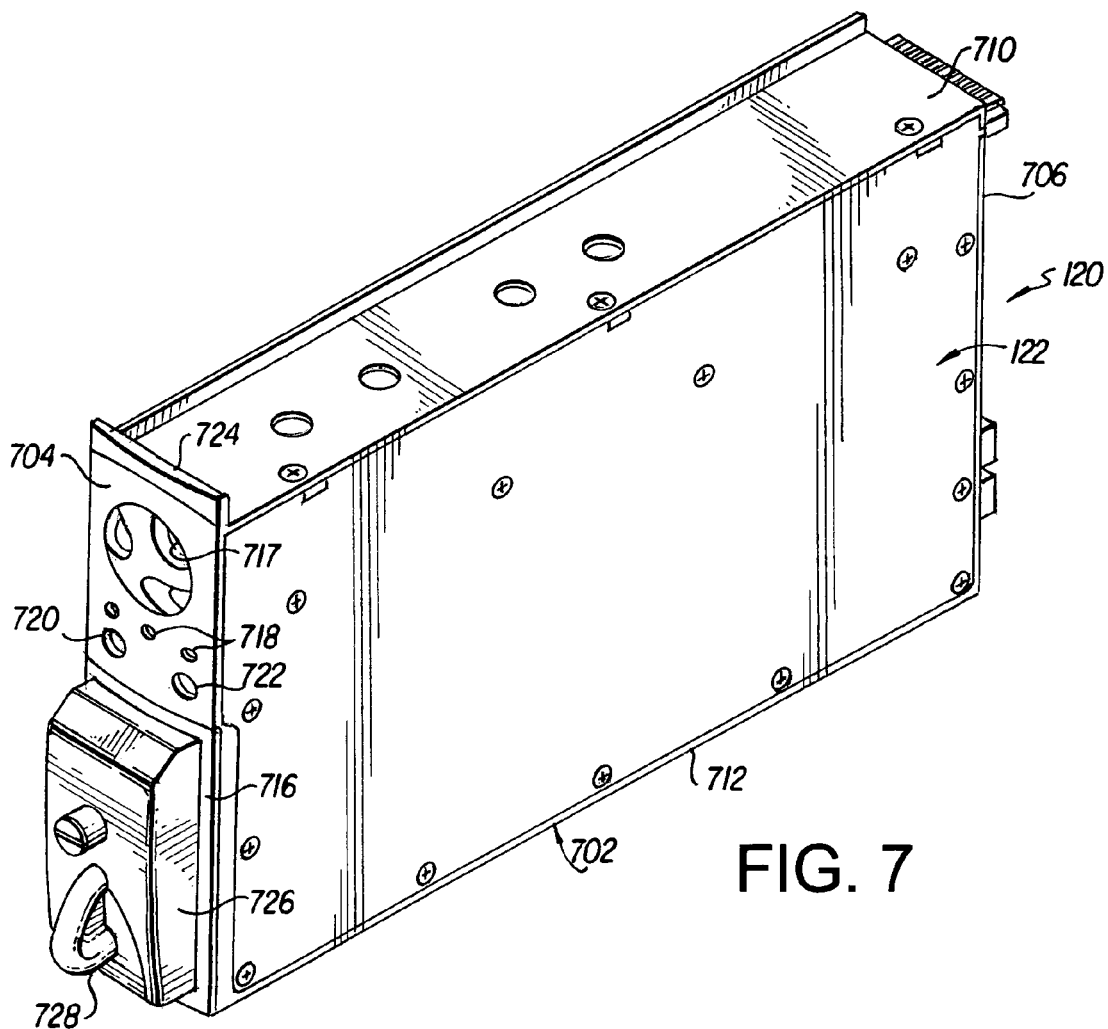
FIG. 7 is a front perspective view of a module of the signal management system illustrated in FIG. 1.

As seen in FIG. 7, the housing 702 includes front and rear walls 704 and 706, sidewalls 708 and top and bottom walls 710 and 712. The front wall 704 includes upper and lower halves 714 and 716. The upper half 714 includes a fan opening 716, a plurality of LED indicators 718 and first and second test point openings 720 and 722. The upper half 714 also includes an upper extension 724 that abuts the chassis upper wall 112, as best seen in FIG. 5. The lower half 714 of the front wall 704 includes a door 726 with a handle 728.

The rear wall 706 of the housing 702 includes first and second input connectors 806 and 808 at input area 802 and a plurality of openings 812 aligned with a plurality of output connectors 810 at output area 804. Output connectors 810 are miniature coaxial connectors (FIG. 10), such as miniature MCX, SMB, MMCX and SMC connectors. The miniature coaxial connectors 810 are substantially smaller than conventional coaxial connectors allowing the modules 122 and 124 to be made significantly smaller and more compact. The smaller modules 122 and 124 are supported by a smaller chassis 110, preferably a 3 RU high chassis, instead of the conventional 5 RU chassis.

Extending from the top and bottom walls 710 and 712 are first and second flanges 820 and 830, respectively. The first and second flanges 820 and 830 preferably extend the length of the housing 702 and are extensions of the housing first sidewall 816 opposite the second sidewall 818, as seen in FIG. 8. However, the flanges 820 and 830 can extend for only a portion of the housing length or be discontinuous along the housing length. The first flanges 820 engage slots 308 and 310 of the chassis upper wall 112 and the second flanges 830 engage the elongated slots 242 of the chassis lower wall 114 when the modules 122 and 124 are installed in the chassis 110.

Figure 10:
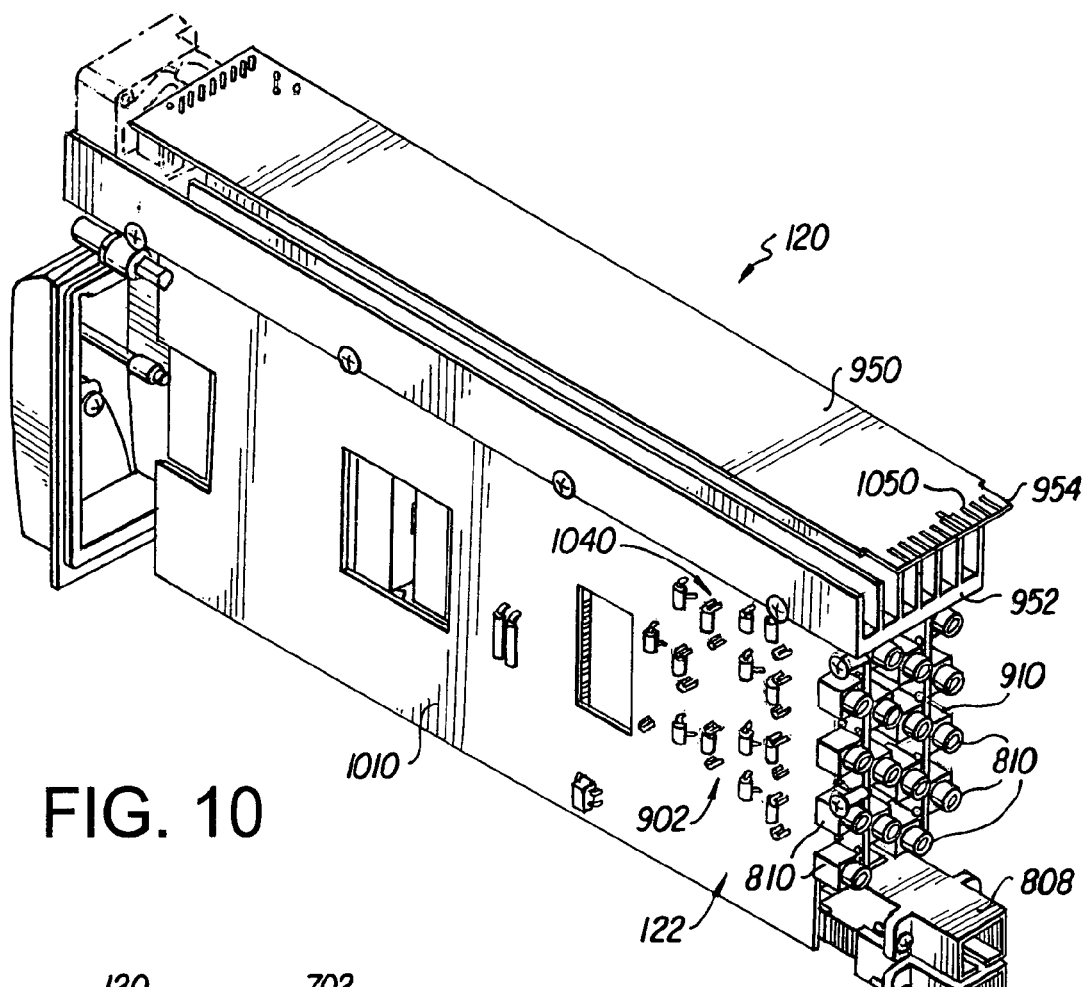
FIG. 10 is a partially exploded rear perspective view of the module illustrated in FIG. 1, showing the modules with the side walls removed.

As seen in FIGS. 9 and 10, the electronic circuitry 902 supported in the housing 702 of the optical and RF signal module 122 generally includes first and second printed circuit boards 910 and 1010 connected to first and second input connectors 806 and 808 and the plurality of output connectors 810, thereby establishing a signal path from the input connectors 806 and 808 to the output connectors 810. Connected to the boards 910 and 1010 are standard first and second amplifiers 920 and 922 and standard first and second optical receivers 930 and 932 so that input optical signals from the input connectors 806 and 808 are converted to RF signals by the first and second optical receivers 930 and 932 and amplified by the first and second amplifiers 920 and 922. Variable attenuators (not shown) can also be provided that attenuate the signals prior to being amplified. Two heat sinks 924 are preferably provided between the amplifiers 920 and 922 and the receivers 930 and 932. A micro-controller 926 is also attached to the boards 910 and 1010. Also attached to the boards 910 and 1010 are first and second RF signal splitters 940 and 1040 so that the RF signals from the optical receivers 930 and 932 are split into multiple RF signals. Each RF signal splitter is preferably an 8-way signal splitter but can be any type of RF signal splitter. Once the signals are split by the first and second RF signal splitters 940 and 1040, the split signals each connect to an individual miniature output connector 810, thereby providing multiple signal outputs. As illustrated, the signals are split 16 ways, thus providing 16 outputs. However, any number of signal outputs can be provided with the modules 122.

A power supply board 950 is provided near the housing top wall 710 with a heat sink 952 disposed between the supply board 950 and boards 910 and 1010. An exposed end 954 of the supply board 950 extends through the housing rear wall 706 and includes a chassis interface 1050 that connects to the card edge connectors 234 of the chassis 110, thereby electrically connecting the modules to one another. Test connectors 960 are connected to boards 910 and 1010 near the housing front wall 704 so that the test connectors 960 are aligned with test point openings 720 and 722. That allows a measuring instrument (not shown) to be inserted through test portion openings 720 and 722 and connected to connectors 960 to evaluate the signals traveling through the module.

Although the optical and RF signal module 122 is illustrated and described as a dual module, that is, it has two input optical signals received through two input connectors 806 and 808 that are converted to RF signals and split, the module 122 can be a single module. A single module would be the same as the dual module, except the single module would include only a single input connector for a single optical signal input that is converted to an RF signal and split. Only a single printed circuit board, a single amplifier, a signal optical receiver, and a single RF splitter, such as an 8-way splitter, are needed for the single module. A second RF signal splitter can be included in the single module to provide redundancy of outputs.

The modules 122 can also be optical transmitters instead of optical receivers. In particular, an optical transmitter would include optical transmitters instead of the optical receivers 930 and 932 and RF signal combiners instead of RF signal splitters 940 and 1040. Also, the signal path for an optical transmitter is reversed with respect to an optical receiver such that the output connectors 810 are input connectors and the input connectors 806 and 808 are outputs and the signal path travels from the connectors 810 to the connectors 806 and 808. Multiple RF signals would enter the module via connectors 810, combined to first and second RF signals by standard RF signal combiners, and converted to optical signals by the optical transmitters.

The modules 122 can also be any type of RF signal passive or active module, an amplifier module, a switching module, a splitter module, an RF detector module, or a power supply module, as long as miniature coaxial connectors, like connectors 810, are used to connect the RF signal carrying cables to electronic circuitry 902, thereby making the modules smaller and more compact. The power supply module 124 supplies power to the chassis 110 and the modules 122. The module 124 is also compact with miniature coaxial connectors incorporated therein.

The modules 122 and 124 are inserted into the front of chassis 110 with the first flanges 820 engaging the slots 308 and 310 of the chassis upper wall 112. The modules 122 and 124 are lifted against the bias of the spring fingers 224 over the front shoulder 244 of the chassis lower wall 114 until the second flanges 830 clear the front shoulder 244. Once the module second flanges 830 clear the front shoulder 244, the second flanges 830 engage the elongated slots 242 of the chassis lower wall 114 allowing the housing bottom wall 712 of the modules 122 and 124 to rest on the raised platform 240 of the chassis lower wall 114. The upper extension 724 of the housing front wall 704 of each of the modules 122 and 124 abuts the front leg 302 of the bracket 206 of the chassis upper wall 112, as seen in FIG. 5, preventing the modules from moving past the front 202 of the chassis 110. The spring fingers 224 engage the housing top wall 710 of the modules 122 and 124, as seen in FIGS. 4, 5 and 7, to bias the modules 122 and 124 toward the chassis lower wall 114. Since the second flanges 830 of the modules 122 and 124 are behind the front shoulder 244, as seen in FIG. 4, the modules 122 and 124 cannot be removed without lifting the modules 122 and 124 against the force of the spring fingers 224 to clear the front shoulder 244. By designing the modules 122 and 124 and the chassis 110 in the above fashion, the modules 122 and 124 can be easily and quickly mounted and secured in the chassis 110 without the need of fasteners. The modules 122 and 124 can also be easily removed from the chassis 110 by lifting the modules.

Figure 11:
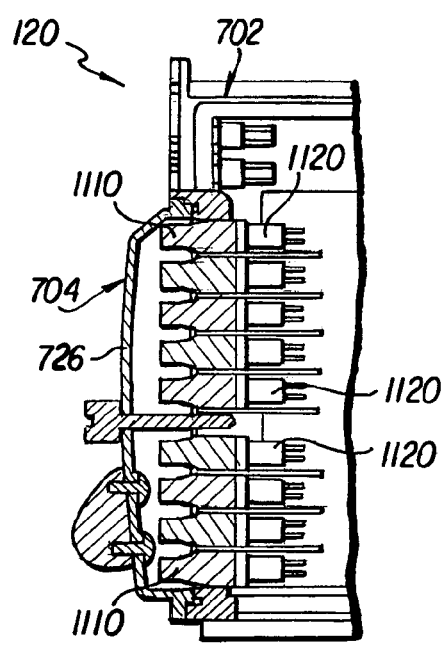
FIG. 11 is side elevational view of another module of the signal management system in accordance with the present invention, showing the module with a side wall removed.
Figure 12:
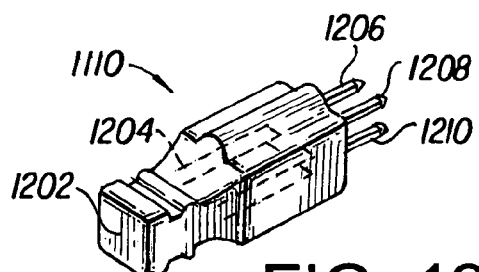
FIG. 12 is a perspective view of a pad of the module illustrated in FIG. 11.

Referring to FIGS. 11 and 12, a plurality of attenuation pads 1110 can be provided in the front wall 704 of the module housing 702 allowing attenuation of the signal or signals of the module. The door 726 of the housing 702 can be opened to gain access to the pads 1110. Each pad 1110 includes a compact non-conductive body 1202 supporting an embedded circuit board 1204. The body 1202 also supports a plurality of pins such as first, second and third pins 1206, 1208 and 1210 in a spaced relationship to one another. A fourth pin is not shown. The pins 1206, 1208 and 1210 are connected at one end to the embedded circuit board 1204 and at the other end to a corresponding socket 1120 disposed on the circuit board of the module, as seen in FIG. 11.

While a particular embodiment has been chosen to illustrate the invention, it will be understood by those skilled in the art that various changes and modifications can be made therein without departing from the scope of the invention as defined in the appended claims.

What is claimed is:

1. A signal management system, comprising:
    a chassis including a biasing member; and
    a plurality of signal management modules supported by said chassis, said biasing member engaging said plurality of modules to hold said modules within said chassis, each module having a housing with input and output connectors and electronic circuitry electrically connecting said input and output connectors, one of said input and output connectors being a miniature coaxial connector, and each of said input and output connectors of said modules being connected to cables carrying one of either RF and optical signals.

2. A signal management system according to claim 1, wherein
    said output connector is a miniature coaxial connector.

3. A signal management system according to claim 1, wherein
    each of said modules includes a plurality of output connectors; and
    each of said output connectors is a miniature coaxial connector.

4. A signal management system according to claim 1, wherein
    each of said modules is selected from the group consisting of an RF signal passive module, an RF signal active module, an amplifier module, a switching module, an RF detector module, a directional coupler module, a power supply module, an RF splitter module, a RF combiner module, an optical signal receiver module, and an optical signal transmitter module.

5. A signal management system according to claim 1, wherein
    said chassis is 3 RU in height.

6. A signal management system according to claim 5, wherein
    said chassis can support up to 24 modules.

7. A signal management system according to claim 1, wherein
    one of said modules is an optical signal receiver module, and said electronic circuitry thereof includes both an optical receiver and an RF signal splitter so that an optical signal entering said one of said modules at said input connector is converted to an RF signal and split into multiple RF signals and said multiple RF signals exit said one of said modules through a plurality of output connectors.

8. A signal management system according to claim 1, wherein
    said chassis includes a printed circuit board, and said printed circuit board includes a plurality of module connectors for connecting to said plurality of modules, respectively, thereby electrically connecting said plurality of modules.

9. A signal management system according to claim 1, wherein
    said plurality of modules are secured within said chassis without fasteners.

10. A signal management system according to claim 1, wherein
    said electronic circuitry includes a second optical signal receiver and a second RF signal splitter.

11. A signal management system according to claim 1, wherein
    said module is supported in a 3 RU high chassis.

12. A signal management system according to claim 11, wherein
    said chassis includes a biasing member that engages said module to hold said module in said chassis.

13. A signal management system, comprising:
    a module including an input connector, a plurality of output connectors, and electronic circuitry disposed within said module electrically connecting said input connector to said plurality of output connectors, said electronic circuitry including a printed circuit board, and at least one optical signal receiver and an RF signal splitter connected to said printed circuit board, said input connector receiving an optical signal carrying cable and each of said plurality of output connectors being connected to an RF signal carrying cable,
    whereby when an optical signal enters said module at said input connector, the signal is converted to an RF signal by said optical receiver and is split into multiple RF signals by said RF signal splitter, each of said multiple RF signals exiting said module at one of said plurality of output connectors.

14. A signal management system according to claim 13, wherein
    each of said plurality of output connectors is a miniature coaxial connector.

15. A signal management system according to claim 13, wherein
said module includes opposite first and second walls; and
said input connector and each of said output connectors are disposed at said second wall.

16. A signal management system according to claim 15, wherein
at least one test connector is located in said first wall, said test connector being electrically connected to said input connector and said output connectors.

17. A signal management system according to claim 15, wherein
at least one attenuation pad is located in said first wall, said attenuation pad being electrically connected to said input connector and said output connector.

18. A signal management system, comprising:
a module including a plurality of input connectors, an output connector, and electronic circuitry disposed within said module electrically connecting said plurality of input connectors to said output connector, said electronic circuitry including a printed circuit board, and at least one optical signal transmitter and an RF signal combiner connected to said printed circuit board, each of said input connectors receiving an RF signal carrying cable and said output connector being connected to an optical signal carrying cable,
whereby when RF signals enter said module at each of said plurality of input connectors, the signals are combined to a single RF signal by said RF signal combiner, the single RF signal is converted to an optical signal by said optical transmitter, and the optical signal exits the module at said output connector.

19. A signal management system according to claim 18, wherein
said module is supported in a 3 RU chassis; and
each of said plurality of input connectors is a miniature coaxial connector.

20. A signal management system according to claim 18, wherein
said plurality of input connectors and said output connector are located at the same wall of said module.

21. A signal management system, comprising:
a chassis having first and second walls, said first wall including a biasing member extending therefrom and said second wall including at least one slot; and
at least one signal management module supported between said first and second walls of said chassis, said module including opposite first and second side walls with a flange extending from said second side wall, said flange being received in said slot of said second wall of said chassis, and said biasing member engaging said first side wall of said module thereby biasing said module toward said second wall of said chassis to hold said module between said first and second walls of said chassis.

22. A signal management system according to claim 21, wherein
said second wall includes a shoulder substantially perpendicular to said slot for limiting the longitudinal movement said flange in said slot.

23. A signal management system according to claim 21, wherein said biasing member is a spring.

24. A signal management system according to claim 21, wherein
said first wall includes a second slot; and
said module includes a second flange extending from said first side wall of said module, said second flange being received in said second slot.

25. A signal management system according to claim 21, wherein
said module is selected from the group consisting of a RF signal passive module, a RF signal active module, an amplifier module, a switching module, a RF detector module, a directional coupler module, a power supply module, a RF splitter module, a RF combiner module, an optical signal receiver module, and an optical signal transmitter module.

26. A signal management system according to claim 21, wherein
said module includes at least one input connector and at least one output connector; and
one of said input and output connectors is a miniature coaxial connector.

27. A signal management system according to claim 26, wherein said chassis is 3 RU in height.

28. A signal management system according to claim 21, wherein
said chassis supports a plurality of signal management modules, each of said modules includes a flange received in a corresponding slot disposed in said second wall of said chassis; and
a plurality of biasing members extend from said first wall of said chassis and engage said plurality of modules to hold said modules in said chassis.

29. A signal management system according to claim 21, wherein
said module is an optical signal receiver module including electronic circuitry a printed circuit board connecting at least one input connector of said module to a plurality of output connectors so that an optical signal entering said input connector is converted to an RF signal by an optical receiver connected to said printed circuit board and split into multiple RF signals by an RF signal splitter connected to said circuit board, and said multiple RF signals exit said module through said plurality of output connectors.

30. A signal management system according to claim 21, wherein
said module includes a plurality of attenuation pads; and
each of said pads includes a non-conductive body supporting a circuit board and a plurality of pins for connecting to a main circuit board of said module.

31. A signal management system, comprising:
a chassis; and
a plurality of signal management modules supported by said chassis, said plurality of modules being secured within said chassis without fasteners, each module having a housing with input and output connectors and electronic circuitry electrically connecting said input and output connectors, one of said input and output connectors being a miniature coaxial connector, and each of said input and output connectors of said modules being connected to cables carrying one of either RF and optical signals.

* * * * *